US009287252B2

(12) United States Patent
Chen et al.

(10) Patent No.: US 9,287,252 B2
(45) Date of Patent: Mar. 15, 2016

(54) SEMICONDUCTOR MISMATCH REDUCTION

(75) Inventors: Chung-Hui Chen, Hsin-Chu (TW);
Ruey-Bin Sheen, Taichung (TW);
Yung-Chow Peng, Hsin-Chu (TW);
Po-Zeng Kang, Hsin-Hua (TW);
Chung-Peng Hsieh, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 529 days.

(21) Appl. No.: 13/048,411

(22) Filed: Mar. 15, 2011

(65) Prior Publication Data
US 2012/0235208 A1  Sep. 20, 2012

(51) Int. Cl.
*H01L 29/12* (2006.01)
*H01L 27/02* (2006.01)

(52) U.S. Cl.
CPC .................. *H01L 27/0207* (2013.01)

(58) Field of Classification Search
CPC .............. H01L 27/0207; H01L 21/02502; H01L 21/0251; H01L 21/02639
USPC .......... 257/E21.53, 191, E29.323; 438/5, 468, 438/67
See application file for complete search history.

(56) References Cited

U.S. PATENT DOCUMENTS

| | | | |
|---|---|---|---|
| 7,642,147 B1* | 1/2010 | Kanakasabapathy | H01L 21/823807 257/E21.632 |
| 8,001,516 B2* | 8/2011 | Smith | G06F 17/5068 716/100 |
| 8,119,473 B2* | 2/2012 | Huang | H01L 21/28247 257/E21.621 |
| 8,129,095 B2* | 3/2012 | Grant | G03F 1/144 430/312 |
| 8,399,181 B2* | 3/2013 | Grant et al. | 430/313 |
| 2002/0157076 A1* | 10/2002 | Asakawa | H01L 21/31053 438/626 |
| 2003/0229875 A1* | 12/2003 | Smith et al. | G06F 17/5068 716/111 |
| 2005/0076320 A1* | 4/2005 | Maeda | G03F 1/144 716/53 |
| 2006/0145274 A1* | 7/2006 | Chidambarrao | H01L 21/823807 257/412 |
| 2007/0015365 A1* | 1/2007 | Chen | H01L 21/3212 438/692 |
| 2007/0181913 A1* | 8/2007 | Li | H01L 21/761 257/213 |
| 2007/0256039 A1* | 11/2007 | White | G06F 17/5068 716/51 |
| 2008/0173934 A1* | 7/2008 | Lee | H01L 21/823807 257/327 |
| 2010/0244141 A1* | 9/2010 | Beyer | H01L 21/28088 257/369 |
| 2010/0289080 A1* | 11/2010 | Wei | H01L 21/823807 257/347 |
| 2011/0004859 A1* | 1/2011 | Summerfelt | G06F 17/5068 716/124 |
| 2011/0049713 A1* | 3/2011 | Frohberg | H01L 21/76895 257/741 |
| 2012/0007187 A1* | 1/2012 | Ryu | H01L 27/0207 257/368 |
| 2012/0086075 A1* | 4/2012 | Huang | H01L 21/28247 257/334 |
| 2012/0286370 A1* | 11/2012 | Li | H01L 21/3247 257/408 |

* cited by examiner

*Primary Examiner* — Stephen W Smoot
*Assistant Examiner* — Edward Chin
(74) *Attorney, Agent, or Firm* — Slater & Matsil, L.L.P.

(57) ABSTRACT

A system and method for reducing density mismatch is disclosed. An embodiment comprises determining a conductor density and an active area density in a high density area and a low density area of a semiconductor device. Dummy material may be added to the low density area in order to raise the conductor density and the active area density, thereby reducing the internal density mismatches between the high density area and the low density area. Additionally, a similar process may be used to reduce external mismatches between different regions on the semiconductor substrate. Once these mismatches have been reduced, empty regions surrounding the different regions may additionally be filled in order to reduce the conductor density mismatch and the active area density mismatches.

20 Claims, 6 Drawing Sheets

SEMICONDUCTOR MISMATCH REDUCTION

BACKGROUND

Generally, semiconductor devices may be filled with regions having various densities of both active areas. In particular, semiconductor devices may have both areas of high pattern density next to areas of low pattern density. Such a difference in density between high pattern density areas and low pattern density areas can become a problem during formation of isolation structures such as shallow trench isolations (STIs). Because there are more structures in the high pattern density areas, the deposition of material in the formation of the STIs into these areas leads to a difference in the rate of removal when, e.g., a chemical mechanical polish is performed. With this, a faster polish rate can occur in the low pattern density area and a slower polish rate can occur in the high pattern density area.

With this difference in polish rates also comes a difference in the step height between STIs and the active areas in the high pattern density area and the step height between STIs and active areas in the low pattern density area. This difference in step height of the STIs can affect not only the length ($L_e$) and impedance ($Z_e$) of adjacent transistors, but can also affect the actual shape of a subsequently formed gate. For example, if the STI has a positive step height (wherein a slower polish rate has caused the STI to extend above a substrate), subsequent lithographic masks will be formed slightly off, causing the gate to be wider than desired and forming an "icicle" shape. Additionally, if there is a negative step height (wherein a faster polish rate has caused the STI to be recessed within the substrate), the subsequent effects on the lithographic masks will cause the subsequently formed gates to be thinner than desired and forming a "dogbone" shape.

BRIEF DESCRIPTION OF THE DRAWINGS

For a more complete understanding of embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that embodiments provide many applicable inventive concepts that can be embodied in a wide variety of specific contexts. The specific embodiments discussed are merely illustrative of specific embodiments, and do not limit the scope of the embodiments.

Embodiments will be described with respect to a specific context, namely a method of using dummy fill materials to address density mismatches in a semiconductor layout. Embodiments may also be applied, however, to other density mismatch issues.

Figure 1:
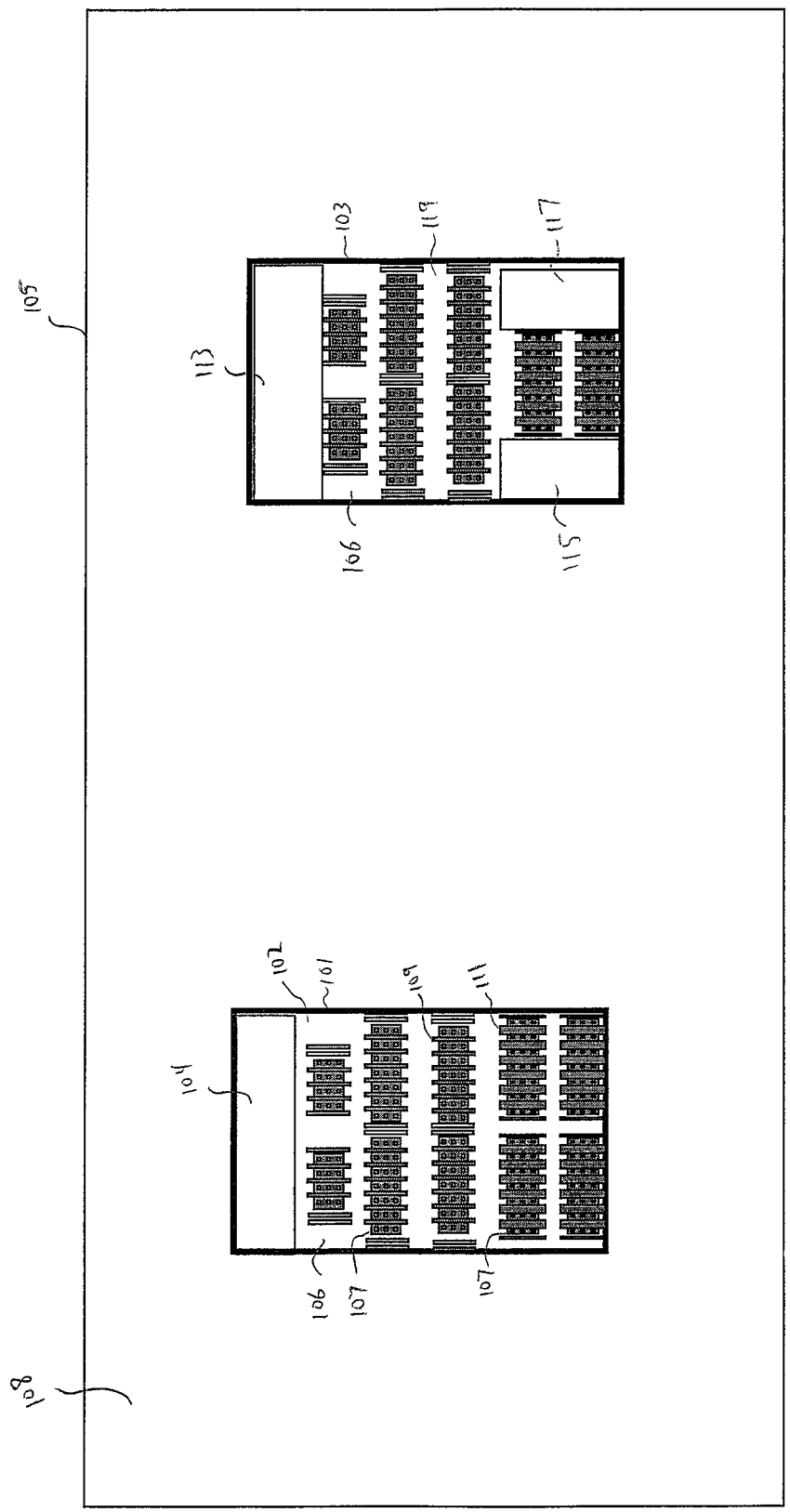
FIG. 1 illustrates a first area of mismatch concern and a second area of mismatch concern located within a first region of a semiconductor substrate in accordance with an embodiment.

With reference now to FIG. 1, there is shown a first area of mismatch concern 101 and a second area of mismatch concern 103 located within a first region of a semiconductor substrate 105. In an embodiment, the structures shown in FIG. 1 may be in the design stage, as the design stage is an easy point in the design process to address density mismatches. However, if desired, the structures illustrated in FIG. 1 may alternatively be manufactured as a test structure and analyzed prior to addressing the density mismatches for subsequently manufactured future products.

The first region of the semiconductor substrate 105 may, in an embodiment, be a region of a semiconductor substrate upon which structures may be manufactured as is known in the art once a desired design is determined. Once manufactured, the first region of the semiconductor substrate 105 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first area of mismatch concern 101 may, in an embodiment, be a design block susceptible to the effects of density mismatch, such as an analog design block, and may be determined by either a designer or by a design tool. For example, the first region of the semiconductor substrate 105 may be a current mirror design block, a differential pair design block, combinations of these, or the like. However, as one of ordinary skill will recognize, embodiments are not meant to be limited to only regions comprising analog device design blocks, as other design blocks, such as digital design blocks comprising, e.g., an SRAM design block, or any other suitable type of semiconductor design block device are also fully intended to be included within the scope of the present embodiments.

Alternatively, instead of being a single design block, the first area of mismatch concern 101 may be a set of different design blocks that may be grouped together for purposes of density matching. For example, the first area of mismatch concern 101 may alternatively comprise a first area, a second area, and a third area (not individually shown in FIG. 1), each of which may have a densities that may be viewed as a group. Such grouping can make density mismatch determinations (described further below) easier when large areas are being calculated, as the different areas are treated as a single area (e.g., the first area of mismatch concern 101) for the purposes of density mismatch reduction.

The first area of mismatch concern 101 may be a region of comparatively high density compared to surrounding areas 108 of the first region of the semiconductor substrate 105. In particular, the first area of mismatch concern 101 may comprise structures and devices (examples of which are discussed further below) that have a higher pattern density than the surrounding areas 108 of the first region of the semiconductor substrate 105, thereby causing a pattern density mismatch between the first area of mismatch concern 101 and the surrounding areas 108 of the first region of the semiconductor substrate 105. The first area of mismatch concern 101 may be set by the designer as desired or as conditions warrant for the easiest method of addressing different regions for density mismatch. As an example only, the first area of mismatch concern may be set as an area of about 10 μm and 10 μm, although other suitable sizes may alternatively be utilized.

Additionally, the first area of mismatch concern 101 may also contain both a first high pattern density region 102 and a first low pattern density region 104 within the first area of mismatch concern 101 itself. Within this internal first high pattern density region 102 there may be located a plurality of semiconductor or other features such as isolation regions 106, active regions 107, short channel gate electrodes 109, and long channel gate electrodes 111. The isolation regions 106, when manufactured, may be shallow trench isolation regions (STIs), which may be formed by etching the semiconductor substrate 105 around the active regions 107 to form trenches and filling the trenches with a dielectric material as is known in the art. The trenches may be filled with a dielectric material such as an oxide material, a high-density plasma (HDP) oxide, or the like, formed by suitable methods known in the art. However, other types of isolation structures could alternatively be used to isolate the active regions 107.

The active regions 107, when manufactured, may comprise areas of the semiconductor substrate 105 which are not removed to form the isolation regions 106 and into which dopants may be implanted in order to form desired structures such as transistors, resistors, etc. Such dopants may include n-type or p-type dopants, or some combination of these dopants, as desired in order to form the desired devices. For example, n-type dopants may be implanted into the active regions 107 to form an n-well which can eventually be used to form n-channel transistors in the active regions 107.

The short channel gate electrodes 109, when manufactured, may comprise a conductive material, such as a doped poly-silicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, or a combination thereof. In an embodiment in which the short channel gate electrodes 109 is poly-silicon, the short channel gate electrodes 109 may be formed by depositing doped or undoped poly-silicon by low-pressure chemical vapor deposition (LPCVD) to a thickness in the range of between about 400 Å and about 2,500 Å, such as about 1,500 Å.

The long channel gate electrodes 111 may comprise a similar material as the short channel gate electrodes 109 (e.g., polysilicon) and may be formed using similar methods (e.g., LPCVD), although different materials and methods may be utilized if desired. The long channel gate electrodes 111 do, however, have a larger width than the short channel gate electrodes 109, thereby making a channel region beneath the long channel gate electrodes 111 longer than a channel region beneath the short channel gate electrodes 109.

With these features located in the first high pattern density region 102, a conductor density of the first high pattern density region 102 may be determined by taking the conductors in the first high pattern density region 102 (such as the short channel gate electrodes 109 and the long channel gate electrodes 111) and dividing their total area by the total area of the first high pattern density region 102. Similarly, an active area density may be determined by taking the area of the active regions 107 within the first high pattern density region 102 and dividing it by the total area of the first high pattern density region 102.

The first low pattern density region 104 may be void of features such as the active regions 107, short channel gate electrodes 109, and long channel gate electrodes 111, and may consist of isolation regions 106. As such, the first low pattern density region 104 may have a conductor density of 0 as well as having an active area density of 0. However, as one of ordinary skill in the art will recognize, the first low pattern density region 104 does not require there to be no features located within the first low pattern density region 104, and the first low pattern density region 104 may include some features (not shown in FIG. 1) and have a positive conductor density and a positive active area density. However, the conductor density and active area density of the first low pattern density region 104 are less than the conductor density and active area density of the first high pattern density region 102, respectively.

From the conductor density of the first high pattern density region 102 and the first low pattern density region 104, a first conductor density of the first area of mismatch concern 101 may be determined. For example, the conductor density of the first high pattern density region 102 and the conductor density of the first low pattern density region 104 may be averaged using their relative areas to arrive at an overall conductor density for the entire first area of mismatch concern 101, the first conductor density.

Alternatively, the first conductor density of the first area of mismatch concern 101 may be initially determined without having to first calculate the conductor density of the first high pattern density region 102 and the first low pattern density region 104. In this example, the first conductor density may be determined by taking the total conductor area within the first area of mismatch concern 101 and dividing it by the total area of the first area of mismatch concern 101. Any suitable method of determining the first conductor density of the first area of mismatch concern 101 may be utilized.

Similarly, a first region active area density may be determined for the first area of mismatch concern 101 by either determining it from the active area density of the first high pattern density region 102 and the active area density of the first low pattern density region 104. Alternatively, the first active area density of the first area of mismatch concern 101 may be initially determined without having to first calculate the active area density of the first high pattern density region 102 and the first low pattern density region 104, for example, by taking the total active area within the first area of mismatch concern 101 and dividing it by the total area of the first area of mismatch concern 101. Any suitable method of determining the first active area density of the first area of mismatch concern 101 may be utilized.

The second area of mismatch concern 103 may be similar to the first area of mismatch concern 101, e.g., an analog design block such as a current mirror design block or a differential pair design block. However, also similar to the first area of mismatch concern 101, the second area of mismatch concern 103 is not intended to be limited to analog design blocks, and may also comprise other design blocks, such as digital design blocks. Additionally, the second area of mismatch concern 103 may also comprise multiple areas with independent structure densities that may be grouped together for convenience.

The second area of mismatch concern 103 may have a second high pattern density region 119, a second low pattern density region 113, a third low pattern density region 115, and a fourth low pattern density region 117. In an embodiment, the second high pattern density region 119 may contain features such as active regions 107, short channel gate electrodes 109, and long channel gate electrodes 111 similar to the first high pattern density region 102. However, the second high pattern density region 119 may have a different layout than the first high pattern density region 102 such that the second area of mismatch concern 103 has a different conductor density and a different active area density than the first area of mismatch concern 101.

Additionally, the second low pattern density region 113, the third low pattern density region 115, and the fourth low pattern density region 117 may be similar to the first low pattern density region 104. For example, the second low pattern density region 113, the third low pattern density region 115, and the fourth low pattern density region 117 may be isolation regions 106 without any other features such as the active regions 107, short channel gate electrodes 109, and long channel gate electrodes 111, although in alternative embodiments some of these features may be included within the second low pattern density region 113, the third low pattern density region 115, and the fourth low pattern density region 117 as long as the second low pattern density region 113, the third low pattern density region 115, and the fourth low pattern density region 117 have a lower conductor density and a lower active area density than the second high pattern density region 119.

From the second high pattern density region 119, the second low pattern density region 113, the third low pattern density region 115, and the fourth low pattern density region 117, a second conductor density may be determined by taking the area of conductors (e.g., the short channel gate electrodes 109 and the long channel gate electrodes 111) within the second area of mismatch concern 103 and dividing them by the area of the second area of mismatch concern 103. Similarly, a second active area density may be determined by taking the area of the active regions 107 within the second area of mismatch concern 103 and dividing it by the area of the second area of mismatch concern 103. This determination may alternatively be done by initially determining conductor densities and active area densities of each of the second high pattern density region 119, the second low pattern density region 113, the third low pattern density region 115, and the fourth low pattern density region 117, and then determining the overall second conductor density and second active area density of the second area of mismatch concern 103 from these individual densities. Any suitable method for determining the second conductor density and the second active area density for the second area of mismatch concern 103 may be utilized.

Figure 2:
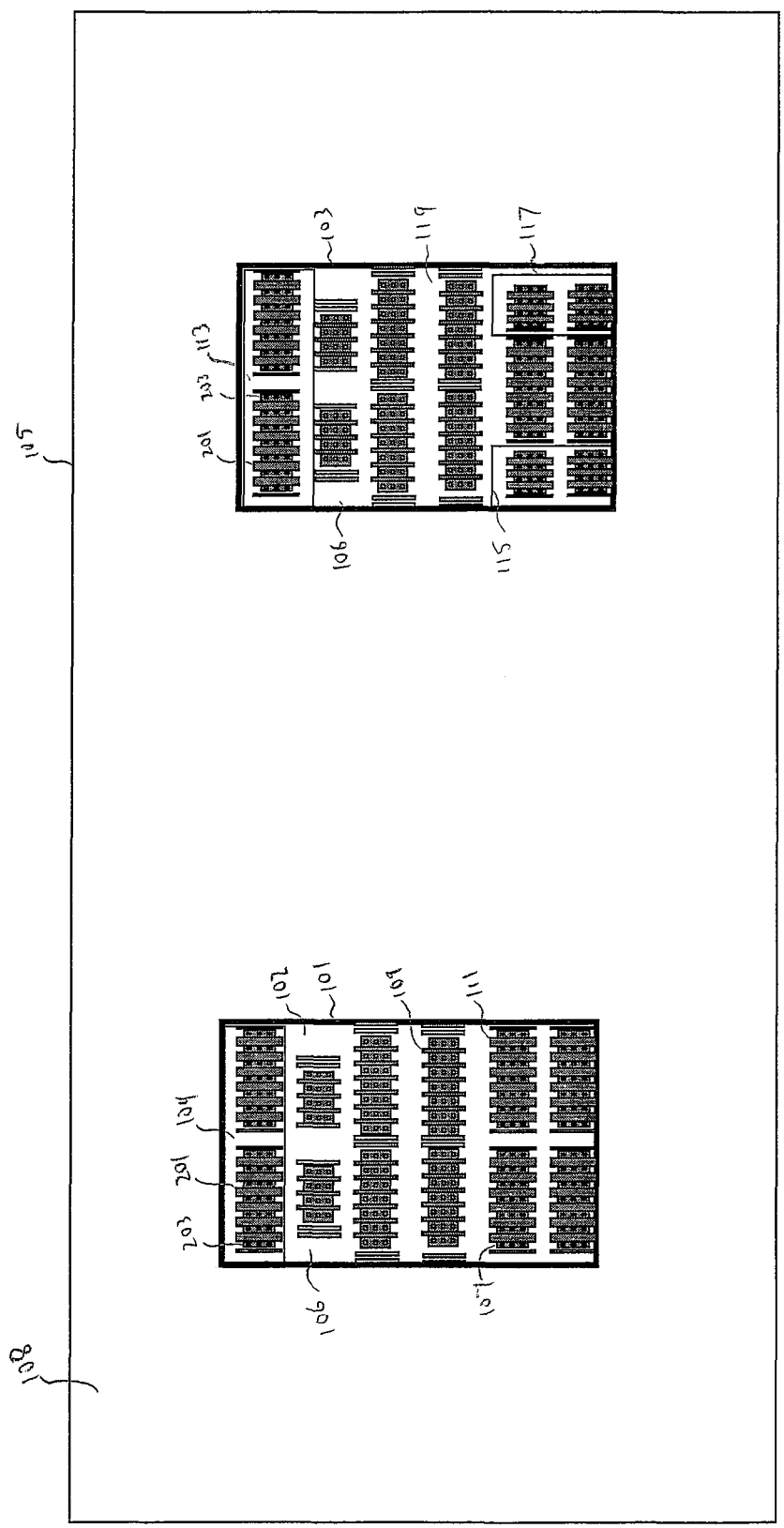
FIG. 2 illustrates the use of dummy material to reduce density mismatch between the first area of mismatch concern and the second area of mismatch concern in accordance with an embodiment.

FIG. 2 illustrates that, once the first conductor density (of the first area of mismatch concern 101) and the second conductor density (of the second area of mismatch concern 103) have been determined, dummy conductor material 201 may be placed into the first low pattern density region 104, the second low pattern density region 113, the third low pattern density region 115, and/or the fourth low pattern density region 117 in order to address conductor density mismatches both internally to the first area of mismatch concern 101 and the second area of mismatch concern 103 as well as to address conductor density mismatches between the first area of mismatch concern 101 and the second area of mismatch concern 103.

For example, and as one example only, looking at the second area of mismatch concern 103, dummy conductor material 201 may be placed within the second low pattern density region 113, the third low pattern density region 115, and the fourth low pattern density region 117 in order to raise the conductor density of these regions in order to reduce the internal mismatch of the second area of mismatch concern 103 between these regions and the second high pattern density region 119. In an embodiment dummy conductor material 201 may be added until the conductor density mismatch between each of the second low pattern density region 113, the third low pattern density region 115, and the fourth low pattern density region 117 is within about 10% of the conductor density of the second high pattern density region 119, such as being within about 5% or even within about 2.5%. However, as one of ordinary skill in the art will recognize, the precise amount of allowable mismatch may be determined from the design and tolerances of the devices located within the second area of mismatch concern 103.

Similarly, looking at the first area of mismatch concern 101, dummy conductor material 201 may be placed within the first low pattern density region 104 in order to address a mismatch of conductor density between the first low pattern density region 104 and the first high pattern density region 102. For example, dummy conductor material 201 may be placed into the first low pattern density region 104 in order to bring the conductor density of the first low pattern density region 104 to within about 10% of the first high pattern density region 102, such as to within about 5% or even within about 2.5%, although the precise amount may be determined from the design and tolerances of the devices located within the first area of mismatch concern 101.

Additionally, while the dummy conductor material 201 may be utilized as described above to reduce the internal conductor density mismatch of the first area of mismatch concern 101 and internal conductor density mismatch of the second area of mismatch concern 103, the addition of dummy conductor material 201 may also be utilized to address conductor density mismatches between the first area of mismatch concern 101 and the second area of mismatch concern 103. For example, in an embodiment in which the second conductor density (of the second area of mismatch concern 103) is lower than the first conductor density (of the first area of mismatch concern 101), dummy conductor material 201 may be added to the second low pattern density region 113, the third low pattern density region 115, and the fourth low pattern density region 117 in order to bring the second conductive density to within a desired mismatch range, such as less than 10% from the first conductor density, such as less than 5% or even less than 2.5% of the first conductor density. Alternatively, if the second conductor density is greater than the first conductor density, dummy conductor material 201 may be added to the first low pattern density region 104 in order to bring the first conductive density to within the desired 10% of the second conductive density, such as to within 2.5% of the second conductive density.

Additionally, if bringing the external conductor mismatches of the first area of mismatch concern 101 and the second area of mismatch concern 103 forces force the internal conductor mismatches out of the desired internal conductor mismatch allowance (e.g., 2.5% mismatch between the first low pattern density region 104 and the first high pattern density region 102), an iterative process can be performed to bring the internal conductor mismatches and the external conductor mismatches into the desired allowances. In such an iterative process dummy conductor material 201 may be added or subtracted from the first low pattern density region 104, the second low pattern density region 113, the third low pattern density region 115, and the fourth low pattern density region 117 as needed in order to bring both the internal conductor mismatches and the external conductor mismatches to within the desired allowances.

For example, once the internal conductor mismatches of both the first area of mismatch concern 101 and the second area of mismatch concern 103 have been addressed, the external conductor mismatches between the first area of mismatch concern 101 and the second area of mismatch concern 103 may be addressed. If addressing the external conductor mismatches pushes the internal conductor mismatches outside of the desired allowance, the internal conductor mismatches may be looked at again and adjusted a second time to bring them back to within the desired allowances. If this second adjustment to the internal conductor mismatches pushes the external conductor mismatches out of their desired allowances, then the external conductor mismatches may be again addressed. This iterative process may be continued until both the internal conductor mismatches and external conductor mismatches are within their respective desired allowances.

However, the iterative process described above is not the only method that may be used to address both the internal conductor mismatches and the external conductor mismatches, and embodiments should not be construed to require the exact process described. Any suitable process of achieving the desired tolerances of both the internal conductor mismatches and the external conductor mismatches, such as a suitable optimization routine or algorithm, may alternatively be utilized and still remain within the scope of the present embodiments.

FIG. 2 also shows that dummy active areas 203 may also be utilized within the first low pattern density region 104, the second low pattern density region 113, the third low pattern density region 115, and the fourth low pattern density region 117 in order to address the internal active area density mismatches (within the first area of mismatch concern 101 and the second area of mismatch concern 103) and the external active area mismatch (between the first area of mismatch concern 101 and the second area of mismatch concern 103). The process of bringing the internal active area density mismatches and the external active area density mismatches may be performed similar to the process described above with respect to the internal conductor mismatches and the external conductor mismatches (e.g., an iterative or other optimization process).

In an embodiment, the dummy active areas 203 may be placed within the first low pattern density region 104 to bring the active area mismatches of the first low pattern density region 104 to within about 10%, such as about 5% or even within about 2.5%, of the first high pattern density region 102. Additionally, the dummy active areas 203 may be placed within the second low pattern density region 113, the third low pattern density region 115, and the fourth low pattern density region 117 to bring the active area mismatches of the second low pattern density region 113, the third low pattern density region 115, and the fourth low pattern density region 117 to within about 10%, such as about 5% or even within about 2.5%, of the second high pattern density region 119. Finally, the dummy active areas 203 may be utilized to bring a first active area density (the overall active area density of the first area of mismatch concern 101) to within about 10%, such as to within about 5% or even within about 2.5%, of the second active area density (the overall active area density of the second area of mismatch concern 103).

The dummy conductor material 201 and dummy active areas 203, in an embodiment, may be placed in order to form other semiconductor structures. For example, the inserted dummy conductor material 201 and dummy active areas 203 may be inserted and placed relative to each other (such as the dummy conductor material 201 overlying the dummy active areas 203) to form such structures as decoupling capacitors, guard rings, MOS transistors, or the like. Alternatively, the dummy conductor material 201 and dummy active areas 203 may be formed separately from each other for the sole purpose of increasing either the conductor density or the active area density. Any suitable combination of dummy conductor material 201 and dummy active areas 203 may alternatively be utilized.

Figure 3:
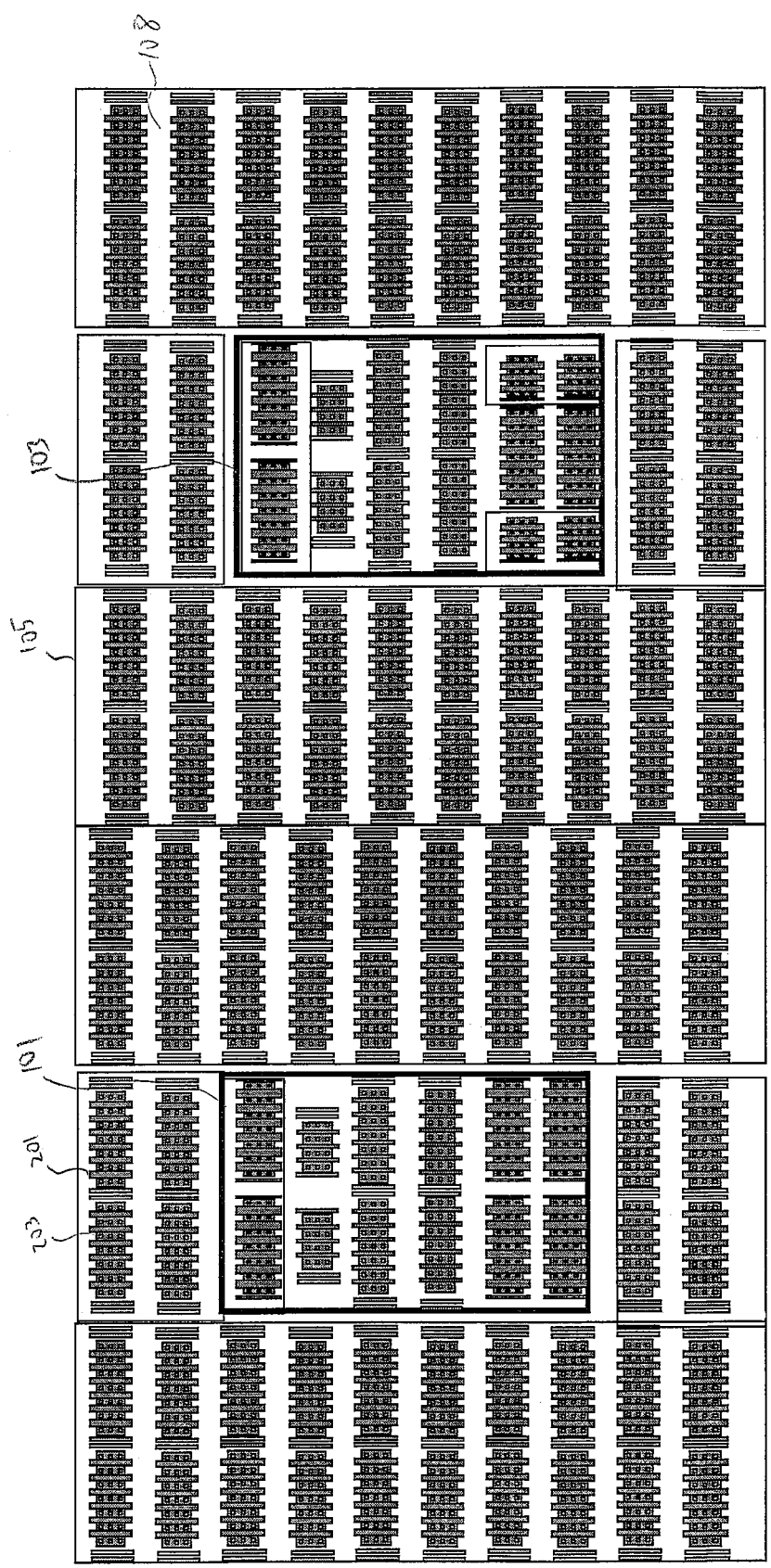
FIG. 3 illustrates the use of dummy material to reduce density mismatch between the first area of mismatch concern, the second area of mismatch concern, and surrounding areas in accordance with an embodiment.

FIG. 3 illustrates the placement of dummy conductor material 201 and dummy active areas 203 into the surrounding areas 108 of the semiconductor substrate 105 around the first area of mismatch concern 101 and the second area of mismatch concern 103 in order to address conductor density and active area density mismatches between the first area of mismatch concern 101 and the second area of mismatch concern 103 and their surroundings. In an embodiment, an average conductor density may be determined by averaging the final conductor density of the first area of mismatch concern 101 and the final conductor density of the second area of mismatch concern 103 (determined as described above with respect to FIG. 2), while an average active area density may be determined by averaging the final active area density of the first area of mismatch concern 101 and the final active area density of the second area of mismatch concern 103.

Once an average conductor density and an average active area density have been determined, dummy conductor material 201 and dummy active areas 203 may be placed into the surrounding areas 108 of the semiconductor substrate 105 around the first area of mismatch concern 103 and the second area of mismatch concern 103 such that the surrounding region has the average conductor density and average active area density. The placement of the dummy conductor material 201 and the dummy active areas 203 may be performed similar to the placement of the dummy conductor material 201 and the dummy active areas 203 within the first low pattern density region 104, the second low pattern density region 113, the third low pattern density region 115, and the fourth low pattern density region 117 (described above with respect to FIG. 2). For example, the dummy conductor material 201 and the dummy active areas 203 may be placed and formed in conjunction with each to form other structures (such as decoupling capacitors, guard rings, etc.), or else may be formed separately from each other.

Additionally, in an embodiment in which the surrounding areas 108 of the semiconductor substrate 105 actually contains some functional structures (not explicitly shown in FIG. 3), the dummy conductor material 201 and dummy active areas 203 may be placed and formed around the functional structures so as to increase the conductor density and the active area density of the surrounding areas 108 of the semiconductor substrate 105 without interfering with the functional structures.

By reducing the density mismatch between areas of high pattern density and areas of low pattern density, subsequent issues of step gate heights, lithographic alignments, and variable gate widths may be reduced. These reductions can improve variations of the threshold voltages between the devices being manufactured, as well as improving variations in drain current between the devices.

Figure 4A:
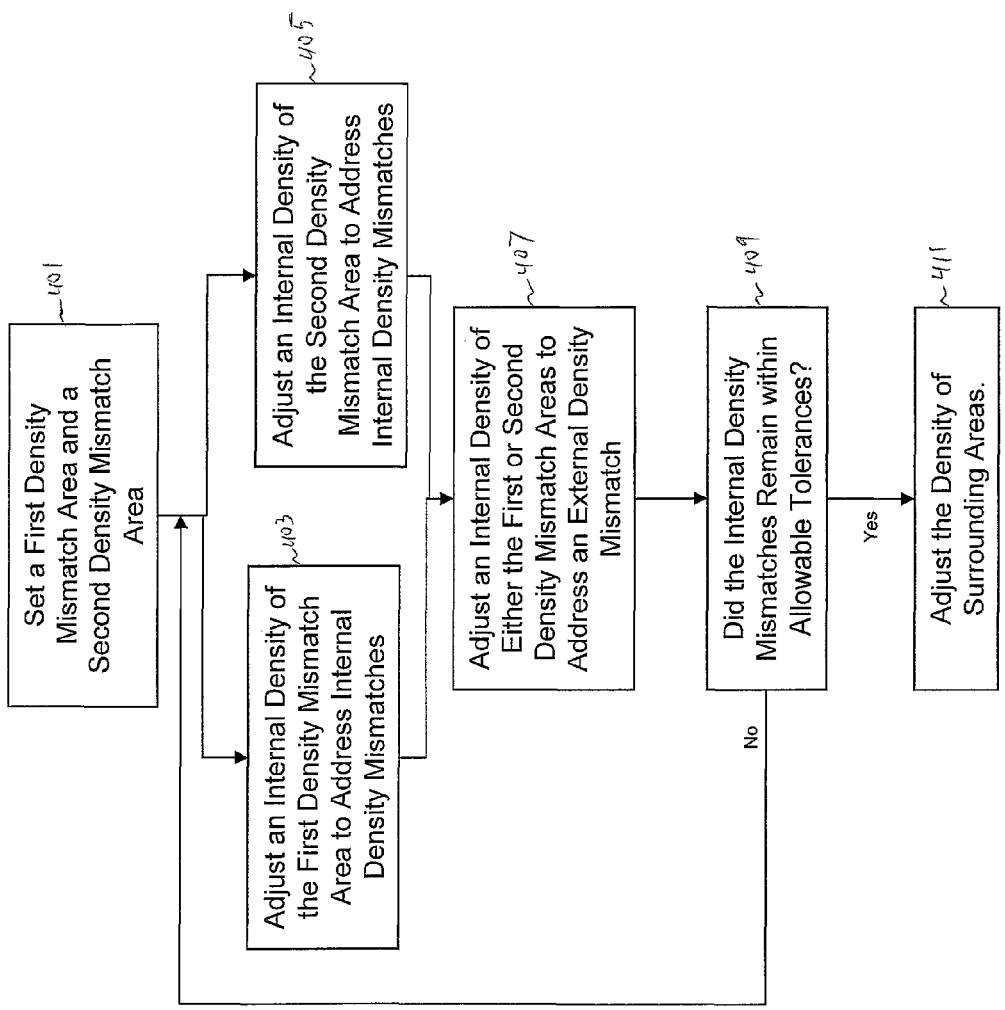
FIGS. 4A-4B illustrate illustrative flow charts in accordance with an embodiment.

FIG. 4A illustrates a flow chart that may be utilized for density mismatch reduction. In a first step of FIG. 4A 401 a first density mismatch area and a second density mismatch area are set. After being set, an internal density of the first density mismatch area may be adjusted to address internal density mismatches of the first density mismatch area in a second step of FIG. 4A 403. Separately from the second step of FIG. 4A 403, an internal density of the second density mismatch area may be adjusted to address internal density mismatches of the second density mismatch area in a third step of FIG. 4A 405. Once the internal density mismatches have been addressed in the second step of FIG. 4A 403 and the third step of FIG. 4A 405, in a fourth step of FIG. 4A 407 the internal densities of either the first or second density mismatch areas may be adjusted to address an external density mismatch between the first density mismatch area and the second density mismatch area.

After the fourth step of FIG. 4A 407, a determination is made as to whether or not the adjustments from the fourth step of FIG. 4A 407 pushed the internal density mismatches outside of their allowable tolerances in a fifth step of FIG. 4A 409. If they did, then the process may be returned to a point prior to the second step of FIG. 4A 403 and the third step of FIG. 4A 405 in order to iteratively bring the internal and external mismatches into their prescribed tolerances. If the adjustments from the fourth step of FIG. 4A 407 did not cause the internal density mismatches to move outside of their allowable tolerances, then the density of areas around the first density mismatch area and the second density mismatch area may be adjusted to address density mismatches between the surrounding areas and the first density mismatch area and the second density mismatch area in a sixth step of FIG. 4A 411.

Figure 4B:
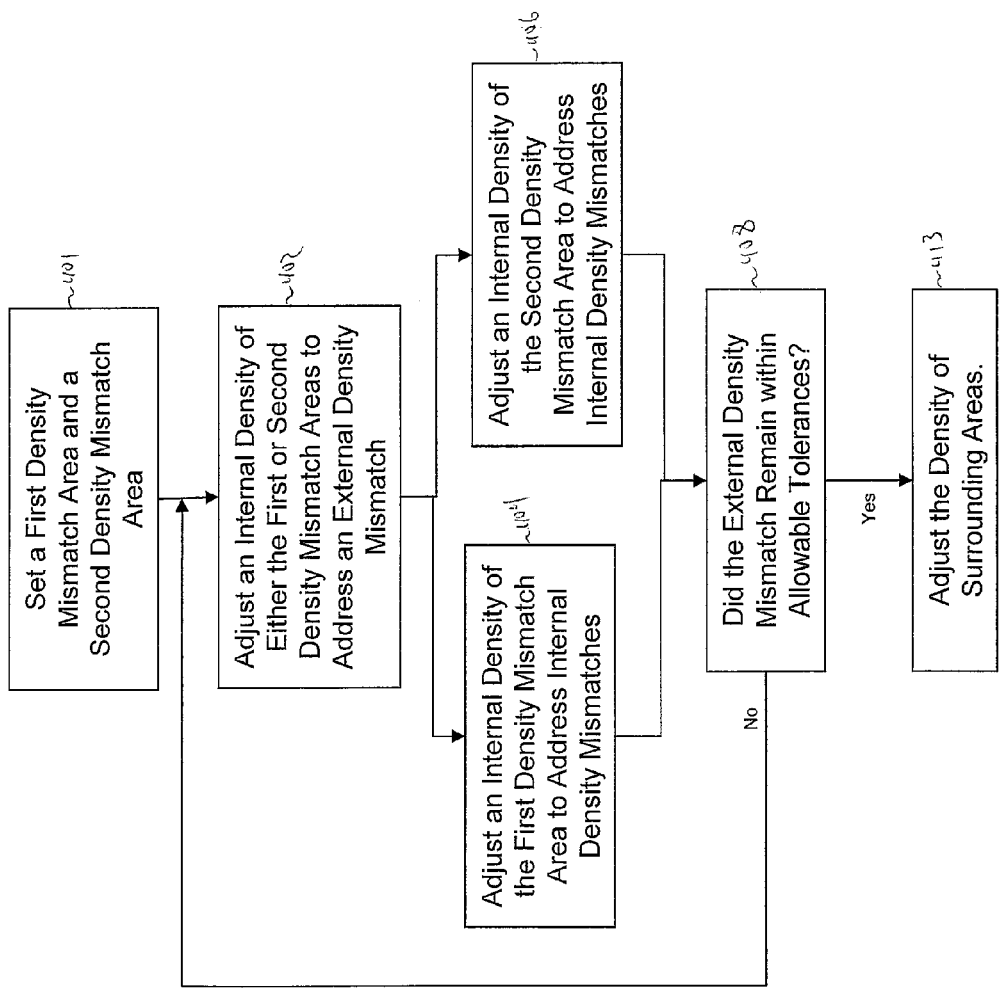

FIG. 4B illustrates an alternative procedure for implemented the embodiments. The first step of FIG. 4B 401 may be similar to the first step 401 illustrated in FIG. 4A, in which a first density mismatch area and a second density mismatch area are set. In a second step 402 of FIG. 4B, an internal density of either the first or second density mismatch areas may be adjusted to address an external density mismatch. After the external density mismatches have been addressed, an internal density of the first density mismatch area may be adjusted to address internal density mismatches in a third step of FIG. 4B 404, and, separately, an internal density of the second density mismatch area may be adjusted to address internal density mismatches of the second density mismatch area in a fourth step of FIG. 4B 406.

After the fourth step of FIG. 4B 406, a determination is made as to whether or not the adjustments from the fourth step of FIG. 4B 406 pushed the external densities outside of their allowable tolerances in a fifth step of FIG. 4B 408. If the adjustments from the fourth step of FIG. 4B 406 did push the external densities outside of their allowable tolerances, then the process returns to a point prior to the second step of FIG. 4B in order to iteratively bring the internal and external mismatches into their prescribed tolerances. If the adjustments from the fourth step of FIG. 4B 406 did not cause the external density mismatches to move outside of their allowable tolerances, then the density of areas around the first density mismatch area and the second density mismatch area may be adjusted to address density mismatches between the surrounding areas and the first density mismatch area and the second density mismatch area in a sixth step of FIG. 4B 413.

However, as one of ordinary skill in the art will recognize, the two procedures laid out in FIGS. 4A and 4B are not the only order of process steps that may be utilized to implement the density mismatch reduction procedures. Any suitable order or rearrangement of process steps may alternatively be utilized and are fully intended to be included within the scope of the embodiments.

Figure 5:
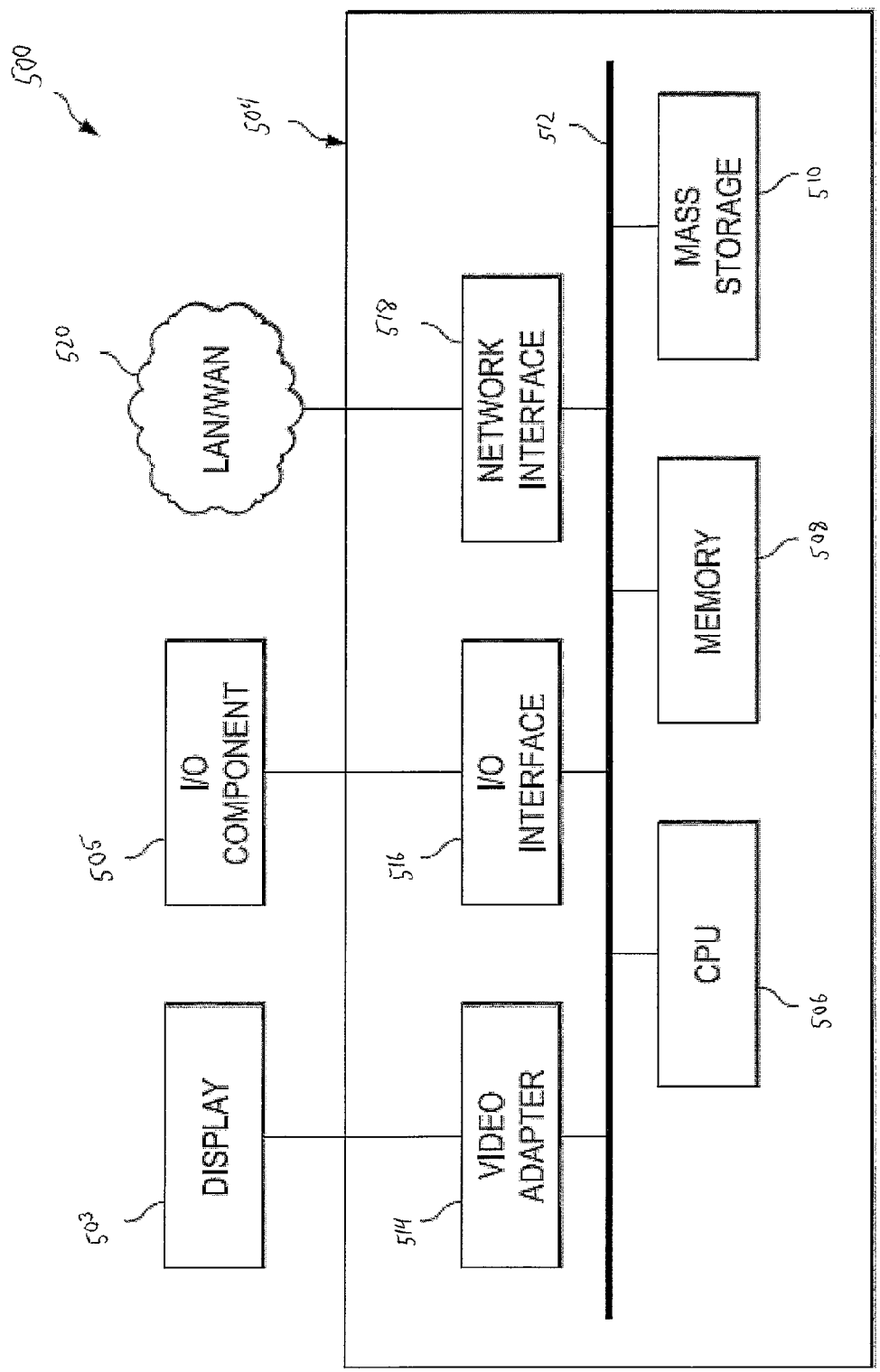
FIG. 5 illustrates a system that may be used to implement the density mismatch reductions in accordance with an embodiment.

FIG. 5 illustrates a block diagram of a processing system 500 that may be used to implement the steps illustrates in FIGS. 4A-4B. The processing system 500 is a general purpose computer platform and may be used to implement any or all of the processes discussed herein. The processing system 500 may comprise a processing unit 504, such as a desktop computer, a workstation, a laptop computer, or a dedicated unit customized for a particular application. The processing system 500 may be equipped with a display 503 and one or more input/output devices 505, such as a mouse, a keyboard, or printer. The processing unit 504 may include a central processing unit (CPU) 506, memory 508, a mass storage device 510, a video adapter 514, and an I/O interface 516 connected to a bus 512.

The bus 512 may be one or more of any type of several bus architectures including a memory bus or memory controller, a peripheral bus, or video bus. The CPU 506 may comprise any type of electronic data processor, and the memory 508 may comprise any type of system memory, such as static random access memory (SRAM), dynamic random access memory (DRAM), or read-only memory (ROM).

The mass storage device 510 may comprise any type of storage device configured to store data, programs, and other information and to make the data, programs, and other information accessible via the bus 512. The mass storage device 510 may comprise, for example, one or more of a hard disk drive, a magnetic disk drive, or an optical disk drive.

The video adapter 514 and the I/O interface 516 provide interfaces to couple external input and output devices to the processing unit 504. As illustrated in FIG. 5, examples of input and output devices include the display 503 coupled to the video adapter 514 and the I/O component 505, such as a mouse, keyboard, printer, and the like, coupled to the I/O interface 516. Other devices may be coupled to the processing unit 504, and additional or fewer interface cards may be utilized. For example, a serial interface card (not shown) may be used to provide a serial interface for a printer. The processing unit 504 also may include a network interface 518 that may be a wired link to a local area network (LAN) or a wide area network (WAN) 520 and/or a wireless link.

It should be noted that the processing system 500 may include other components. For example, the processing system 500 may include power supplies, cables, a motherboard, removable storage media, cases, and the like. These other components, although not shown, are considered part of the processing system 500.

Embodiments of the mismatch reduction procedures (e.g., the procedures illustrated in FIGS. 1-4B) may be implemented on the processing system 500, such as by program code executed by the CPU 506. For instance, the mismatch reduction procedures may be input into the processing system 500 by inputting each of the individual steps using, e.g., I/O component 505. Additionally, the mismatch reduction procedures may be stored in the mass storage device 510. When desired, a user (not shown) may use the CPU 506 and the memory 508 to implement the mismatch reduction procedures.

In accordance with an embodiment, a method for reducing mismatch comprising determining a numerical first density in a high density region of a semiconductor substrate and a second density in a low density region of the semiconductor substrate, the high density region being adjacent the low density region is provided. The second density in the low density region is raised by adding dummy material in the low density region.

In accordance with another embodiment, a method for reducing mismatch comprising calculating a first density in a first region of a semiconductor device and a second density in a second region of the semiconductor device is provided. The first density and the second density are adjusted to generate an adjusted first density and an adjusted second density, the adjusting comprising adding dummy material to the first region and the second region, the adjusting also reducing a first density mismatch between the first region and the second region.

In accordance with yet another embodiment, a semiconductor device comprising a first region on a semiconductor substrate, the first region having a first density and comprising a first functional region and a first dummy region is provided. A second region is located on the semiconductor substrate, the second region having a second density and comprising a second functional region and a second dummy region, wherein the first density and the second density are within 2.5% of each other Although embodiments and their advantages have been described in detail, it should be understood that various changes, substitutions and alterations can be made herein without departing from the spirit and scope of the embodiments. For example, while the density mismatches have been described in terms of conductor densities and active areas densities, other structural densities may also be utilized to reduce density mismatches within a semiconductor device.

Moreover, the scope of the present application is not intended to be limited to the particular embodiments of the process, machine, manufacture, composition of matter, means, methods and steps described in the specification. As one of ordinary skill in the art will readily appreciate from the disclosure of embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for reducing mismatch comprising:
   determining a numerical first density and a numerical second density in a high density region of a semiconductor substrate and a numerical third density and a numerical fourth density in a low density region of the semiconductor substrate, the high density region being adjacent the low density region, wherein the first density is an active area density and the second density is a conductor density;
   comparing the numerical first density to the numerical third density;
   comparing the numerical second density to the numerical fourth density; and
   based on the comparing the numerical first density to the numerical third density and based on comparing the numerical second density to the numerical fourth density, raising at least one of the third density or the fourth density in the low density region by adding dummy material in the low density region.

2. The method of claim 1, further comprising:
   determining a first overall density of a first region, wherein the first region comprises the high density region and the low density region;
   determining a second overall density of a second region of the semiconductor substrate; and
   adjusting either the first overall density or the second overall density to reduce a density mismatch between the first region and the second region.

3. The method of claim 2, wherein the adjusting either the first overall density or the second overall density reduces the density mismatch between the first region and the second region to within 2.5% of each other.

4. The method of claim 2, further comprising adding the dummy material to a third region outside of and adjacent to the first region, the adding the dummy material raising a fifth density of the third region to reduce the density mismatch between the third region and the first region.

5. The method of claim 1, wherein the raising at least one of the third density or the fourth density reduces a density mismatch between the low density region and the high density region to within 2.5% of each other.

6. The method of claim 1, wherein determining the first numerical density comprises dividing the total area of the active regions within the semiconductor substrate in the high density region by the total area of the high density region.

7. The method of claim 1, wherein determining the second numerical density comprises dividing the total area of the gate electrodes in the high density region by the total area of the high density region.

8. A method for reducing mismatch comprising:
   calculating a first density in a first region of a semiconductor device and a second density in a second region of the semiconductor device, wherein the first density is a conductor density;
   calculating a third density in the first region and a fourth density in the second region, wherein the third density is an active area density;
   determining a first difference between the first density and the second density;
   determining a second difference between the third density and the fourth density;
   performing a first adjusting of the first density and the second density based on the first difference to generate an adjusted first density and an adjusted second density;
   performing a second adjusting of the third density and the fourth density based on the second difference to generate an adjusted third density and an adjusted fourth density;
   wherein at least one of the first adjusting or the second adjusting comprises adding dummy material to at least one of the first region or the second region, the adjusting also reducing a first density mismatch between the first region and the second region;
   determining an adjusted first difference between the adjusted first density and the adjusted second density; and
   determining an adjusted second difference between the adjusted third density and the adjusted fourth density.

9. The method of claim 8, wherein at least one of the first adjusting or the second adjusting is continued until the first density mismatch is less than about 2.5%.

10. The method of claim 8, further comprising:
    determining a first internal density in a high density region of the first region;
    determining a second internal density in a low density region of the first region; and
    adjusting the second internal density in the low density region until an internal density mismatch between the first internal density and the second internal density is less than about 2.5%, the adjusting comprising adding the dummy material to the low density region.

11. The method of claim 8, further comprising:
    adjusting the third density and the fourth density by adding dummy material to the first region and the second region, the adjusting reducing a second density mismatch between the first region and the second region.

12. The method of claim 8, further comprising:
    determining an average density from the adjusted first density and the adjusted second density; and
    adjusting a fifth density in a third region to the average density, the third region being between the first region and the second region.

13. The method of claim 8, wherein calculating the first density comprises dividing the total area of the gate electrodes in the first region by the total area of the first region.

14. The method of claim 8, wherein calculating the third density comprises dividing the total area of the active regions in the first region by the total area of the first region.

15. A method for reducing mismatch comprising:
calculating a first numerical density that represents a first density of first conductive structures in a first region, wherein the first conductive structures are part of first active devices;
calculating a second numerical density that represents a second density of second conductive structures in a second region, wherein the second conductive structures are part of second active devices;
calculating a third numerical density that represents a third density of third conductive structures in the first region;
calculating a fourth numerical density that represents a fourth density of fourth conductive structures in the second region;
comparing the first numerical density to the second numerical density to determine a first numerical percentage difference between the first numerical density and the second numerical density;
comparing the third numerical density to the fourth numerical density to determine a second numerical percentage difference between the third numerical density and the fourth numerical density;
adjusting the first density or the second density based at least in part on the comparing the first numerical density to the second numerical density; and
adjusting the third density or the fourth density based at least in part on the comparing the third numerical density to the fourth numerical density.

16. The method of claim 15, wherein the first density of first conductive structures is an active area density, wherein the active area density is part of a semiconductor substrate.

17. The method of claim 15, wherein the third density of third conductive structures is a gate electrode density.

18. The method of claim 15, wherein the adjusting the first density or the second density is continued until a first density mismatch is less than about 2.5%.

19. The method of claim 15, further comprising:
adjusting at least one of the first density, second density, third density, or the fourth density by adding dummy material to at least one of the first region or the second region, the adjusting reducing a density mismatch between the first region and the second region, wherein the third density is a gate electrode density and the first density is an active area density.

20. The method of claim 15, further comprising:
determining an average density after the adjusting at least one of the first density, the second density, the third density, or the fourth density; and
adjusting a fifth density in a third region to the average density, the third region being between the first region and the second region.

* * * * *